United States Patent [19]
Tanaka et al.

[11] Patent Number: 6,008,495
[45] Date of Patent: Dec. 28, 1999

[54] ELECTRON BEAM EXPOSURE DEVICE

[75] Inventors: Hitoshi Tanaka, Tokyo; Yoshihisa Ooae, Kawasaki, both of Japan

[73] Assignee: Fujitsu Limited, Kawasaki, Japan

[21] Appl. No.: 08/927,817

[22] Filed: Sep. 11, 1997

[30] Foreign Application Priority Data

Jan. 10, 1997 [JP] Japan ..................... 9-003378

[51] Int. Cl.⁶ .................. G21K 1/02; G21K 5/08
[52] U.S. Cl. ............... 250/396 R; 250/398; 250/491.1
[58] Field of Search ................... 250/396, 397, 250/398, 400, 491.1, 492.2

[56] References Cited

U.S. PATENT DOCUMENTS

| | | | |
|---|---|---|---|
| 4,087,729 | 5/1978 | Yamazaki et al. | 318/601 |
| 5,177,365 | 1/1993 | Yamada | 250/492.2 |
| 5,182,615 | 1/1993 | Kurosawa et al. | 356/400 |
| 5,681,638 | 10/1997 | Korenaga | 428/119 |

*Primary Examiner*—Edward P. Westin
*Assistant Examiner*—Albert Gagliardi
*Attorney, Agent, or Firm*—Staas & Halsey

[57] ABSTRACT

An electron beam exposure device in which an electron beam from an electron beam source is passed through at least a slit of a first slit assembly. The first slit assembly includes: a base; a bearing assembly; a stage rotatably supported by the base via the bearing assembly; a stage rotation adjusting mechanism; a slit member; and at least one heat transfer path means for transferring heat of the stage to the base, wherein the at least one heat transfer path means enables the rotation of the stage by the stage rotation adjusting mechanism.

18 Claims, 10 Drawing Sheets

ELECTRON BEAM EXPOSURE DEVICE

BACKGROUND OF THE INVENTION

1. Field of the Invention

The present invention generally relates to electron beam exposure devices, and more particularly, to a block type electron beam exposure device or a variable rectangular type electron beam exposure device, having a heat dissipating ability. By such electron beam exposure devices, an electron beam is formed into a beam having a rectangular cross-section by being passed through a slit assembly, and thus forms a beam which may be projected onto a wafer.

2. Description of the Related Art

Recently, demands have increased for an electron beam exposure device such as a precise forming of a LSI (large-scale integrated circuit) pattern which may reliably correspond to a fine structure of the LSI and a high-speed forming of the fine LSI pattern in order to improve a throughput of the circuit.

FIGS. 1A, 1B and 2 are diagrams showing a conventional first slit assembly 10 which is provided next to an electron gun in a conventional block type electron beam exposure device. FIG. 1A is a diagram showing a top view of the first slit assembly 10 and FIG. 1B is a diagram showing a cross-sectional view of the slit assembly 10. FIG. 2 is a diagram showing a cross-sectional view of a region of a stage of the first slit assembly 10 in a magnified scale.

As shown in these figures, the first slit assembly 10 used in a conventional block type electron beam exposure device is comprised of a housing 11, a base 12, a bearing 13, a stage 14, a slit member 16, worm gear 17, a motor 20, an exhaust port 21, and a cover 23.

The base 12 is fixed in the housing 11 and the stage 14 is rotatably supported by the base 12 with respect to a vertical axis 15 via the bearing 13. The slit member 16 is fixed on the stage 14 and the worm gear 17 is provided with the stage 14. The slit member 16 has a structure in which a plurality of slit forming members 26 are combined with each other so that a slit 25 having substantially a rectangular shape is formed in a center thereof. Each of the slit forming members 26 may be made of such metal as molybdenum having excellent thermal resistance.

The worm gear 17 may be comprised of a worm wheel 18, which is integrally formed with the stage 14, and a worm 19, which is supported by the base 12. The worm 19 is actuated by the motor 29 which is provided outside of the housing 11. The interior of the housing 11 may be maintained in a vacuum via the exhaust port 21. The slit member 16 is covered by the cover 23, which is fixed to the base 12, having a hole 22 at substantially the center thereof.

The electron beam irradiated from the electron gun passes through the hole 22 and reaches the slit 25 where a peripheral portion of the beam is blocked by the slit member 16. Thus, the electron beam which is passed through the slit 25 has a cross-section matched with the shape of the slit 25 (a rectangular shape in this case). The electron beam from the first slit assembly 10 having a cross-section of a rectangular shape may be projected onto a wafer through electromagnetic lenses and deflectors so that a LSI pattern is precisely formed on the wafer.

On the other hand, the reason that the stage 14 should be rotated with respect to the vertical axis 15 is that a phase of a second slit assembly (to be described later) is slightly rotated with respect to the electron beam whose cross-section is formed in a rectangular shape by the first slit assembly 10 due to the setting accuracy of the electromagnetic lens L1b or a subtle change in the strength of the electromagnetic lens Lb1 and it is necessary to carry out an adjustment operation corresponding to the above rotation. The adjustment, in which the stage 14 is rotated with respect to the vertical axis 15, may be made by appropriately operating the motor 20 before the irradiation of an electron beam so that the stage 14 is rotated, via the worm gear 17, in a range of a few degrees. In this manner, the parallelism and the vertical relationship of the electron beam passed through the first slit assembly 10 with respect to the sides of the second slit assembly may be adjusted within a predetermined range.

As mentioned above, when the cross-section of the electron beam is shaped into a rectangular form by the slit member 16, the peripheral portion of the electron beam is blocked by and irradiated onto the slit member 16. Thus, the temperature of the slit member 16 is increased by the electron beam. In order to lower the temperature of the slit member 16, the heat generated in the slit member 16 may be transferred to, in order, the stage 14, the base 12 and the housing 11.

However, as indicated by an arrow 30 in FIG. 2, the heat transfer path from the stage 14 to the base 12 is narrowed by the plurality of balls of the bearing 13, whose contacting area is restricted (i.e., small) and unstable due to the circular shape thereof. Thus, the heat transfer efficiency from the stage 14 to the base 12 tends to become insufficient, and hence the temperature of the slit member 16 tends to be increased depending on the irradiation time and strength of the electron beam. If the temperature of the slit member 16 exceeds a certain limit, the slit member 16 may be melted or physically damaged, and hence a precise forming of a circuit pattern cannot be achieved by the slit member 16.

Also, because of this tendency of the slit member 16 to be heated to a high temperature, it is difficult to increase the strength of the electron beam in order to increase the speed of forming a circuit pattern using a conventional electron beam exposure device.

Moreover, when ozone gas is used to eliminate charge-up (or dust) in the column of the electron beam exposure device, the surface of the slit member 16 is easily oxidized upon contact with the ozone gas since the temperature of the slit member 16 is high. If the surface of the slit member 16 (the surface of the slit 25) is oxidized, the sides of the rectangular cross-section of the electron beam is no longer sufficiently straight, and hence a precision of a circuit pattern formed by the irradiation of the thus formed electron beam is lowered.

Further, the effect of a backlash associated with the worm gear 17 is likely to occur appeared as a slight shift in position of the stage 14 in the rotation direction. If the position of the stage 14 in the rotation direction is changed, an image projected onto a wafer through the slit is shifted in the rotation direction and a precision of a circuit pattern will also be decreased.

SUMMARY OF THE INVENTION

Accordingly, it is a general object of this invention to provide an electron beam exposure device in which the above-mentioned problems are eliminated.

A more specific object of the present invention is to provide an electron beam exposure device by which a precise forming of a LSI pattern which may reliably correspond to a fine structure of the LSI may be achieved by rotating a stage in a first slit assembly.

Another object of the present invention is to provide an electron beam exposure device by which a high-speed forming of a fine LSI pattern may be achieved and production may be increased due to presence of a heat transfer path means which is capable of efficiently decreasing a temperature of a slit.

Yet another object of the present invention is to provide an electron beam exposure device having excellent reliability and stability.

Yet another object of the present invention is to provide a method for irradiating an electron beam using the above-mentioned electron beam exposure devices.

The objects described above are achieved by an electron beam exposure device in which an electron beam from an electron beam source is passed through at least a slit of a first slit assembly, the first slit assembly comprising: a base; a bearing assembly; a stage rotatably supported by the base via the bearing assembly; a stage rotation adjusting mechanism; a slit member; and at least one heat transfer path means for transferring heat of the stage to the base, wherein the at least one heat transfer path means enables the rotation of the stage by the stage rotation adjusting mechanism.

The objects described above are also achieved by the electron beam exposure device, wherein the at least one heat transfer path means is comprised of an elastic portion provided between the stage and the base.

The objects described above are also achieved by the electron beam exposure device, wherein the elastic portion is comprised of a plurality of leaf spring members.

The objects described above are also achieved by the electron beam exposure device, wherein the plurality of leaf spring members are provided in a circumferential direction with equal spacing therebetween.

The objects described above are also achieved by the electron beam exposure device, wherein each of the plurality of leaf spring members has a curved shape.

The objects described above are also achieved by the electron beam exposure device, wherein each of the plurality of leaf spring members has a plate-like shape.

The objects described above are also achieved by the electron beam exposure device, wherein the elastic portion is comprised of a single leaf spring member.

The objects described above are also achieved by the electron beam exposure device, wherein the single leaf spring member has a plate-like shape.

The objects described above are also achieved by the electron beam exposure device, wherein irradiation of the electron beam is performed during the elastic portion is elastically deformed.

According to the above electron beam exposure device, since at least one heat transfer path means between the stage and the base, which transfers heat of the stage to the base and makes the rotation of the stage possible by the stage rotation adjusting mechanism is provided, the heat of the slit member which is generated and increased by the irradiation of an electron beam may be efficiently transferred to the base, and hence it is possible to lower the temperature of the slit member compared with a conventional electron beam exposure device. Thus, melting or damaging of the slit member may be avoided and a circuit pattern may be formed with high precision.

Also, since the temperature of the slit member may be kept low, the portion of the slit member which is necessarily a thermal resistance material can be reduced, and hence a manufacturing cost of the electron beam exposure device may be decreased.

Moreover, when a thermal resistance material is used for the slit member, the strength of an electron beam may be increased, and hence the speed of forming a circuit pattern can be enhanced and LSI production may be increased.

The objects described above are achieved by an electron beam exposure device in which an electron beam from an electron beam source is passed through at least a slit of a first slit assembly, the first slit assembly comprising: a base; a bearing assembly; a stage rotatably supported by the base via the bearing assembly; a stage rotation adjusting mechanism; and a slit member, wherein the stage comprises: a main body to which the slit member is fixed, a flange portion fixed to the base and located outside of the main body so as to partially surround the main body, and a spring portion, provided between the main body and the flange portion, which transfers heat of the main body to the flange portion and is elastically deformed so as to enable the main body to rotate with respect to the flange portion.

According to the above electron beam exposure device, the stage is comprised of a main body to which the slit member is fixed. A flange portion fixed to the base, is located outside of the main body so as to partially surround the main body, and a spring portion is provided between the main body and the flange portion. The spring portion may be elastically deformed so as to make the main body rotate a few degrees with respect to the flange portion and transfer heat of the main body to the flange portion. The heat of the slit member which is generated and increased by the irradiation of an electron beam may be efficiently transferred to the base through the spring portion.

In addition, since the spring portion forms a part of the stage, it can be constructed integrally with the stage without using any additional parts.

The objects described above are also achieved by the electron beam exposure device, wherein the spring portion is comprised of a plurality of leaf spring members.

The objects described above are also achieved by the electron beam exposure device, wherein the plurality of leaf spring members are provided in a circumferential direction with equal spacing therebetween.

The objects described above are also achieved by the electron beam exposure device, wherein each of the plurality of leaf spring members has a curved shape and a first end is connected to the main body and a second end is connected to the flange portion.

According to the above electron beam exposure device, since each of the leaf spring members may be equally expanded or contracted, the position of the center of the main body is not moved when the main body is rotated. Thus, no force in the radial direction is acts on the bearing when the main body is rotated, and hence generation of uneven contact of the bearing may be avoided.

The objects described above are also achieved by the electron beam exposure device, wherein each of the plurality of leaf spring members has a plate-like shape.

According to the above electron beam exposure device, since each of the plurality of leaf spring members has a plate-like shape, the cross-section of the leaf member may be increased, and hence the heat transfer resistance of the leaf spring member may be reduced. Thus, the heat of the slit member may be efficiently transferred through the spring member.

The objects described above are also achieved by the electron beam exposure device, wherein the spring portion is comprised of a single leaf spring member, provided so as to surround the main body, a first end of the leaf spring member is connected to the main body and a second end is connected to the flange portion.

According to the above electron beam exposure device, since the entire portion of the leaf spring member may be equally expanded or contracted, the position of the center of the main body is not moved when the main body is rotated. Thus, no force in the radial direction acts on the bearing when the main body is rotated, and hence generation of uneven contact of the bearing may be avoided.

The objects described above are also achieved by the electron beam exposure device, wherein the single leaf spring member has a plate-like shape.

According to the above electron beam exposure device, since the leaf spring member has a plate-like shape, the cross-section of the leaf member may be increased, and hence the heat transfer resistance of the leaf spring member may be reduced. Thus, the heat generated in the slit member may be efficiently transferred through the spring member.

The objects described above are also achieved by the electron beam exposure device, wherein irradiation of the electron beam is performed during the spring portion is elastically deformed.

According to the above electron beam exposure device, since an irradiation of an electron beam is performed during the spring portion is elastically deformed and at that time a returning force to an original position is applied to the main body, the main body may be pulled in a direction to which the returning force is effected. Thus, it is possible to prevent unnecessary movement of the main body even when there is a backlash associated with the stage rotation adjusting mechanism. Therefore, the effect of the backlash does not result in a shift of a position in the rotation direction of the stage, and hence an image, which is projected on a wafer through the slit assembly, etc., may be stabilized and a circuit pattern formation may be carried out accurately.

Other objects and further features of the present invention will be apparent from the following detailed description when read in conjunction with the accompanied drawings.

DESCRIPTION OF THE PREFERRED EMBODIMENTS

In the following, a principle and an embodiment of the present invention will be described with reference to the accompanying drawings.

Figure 3:
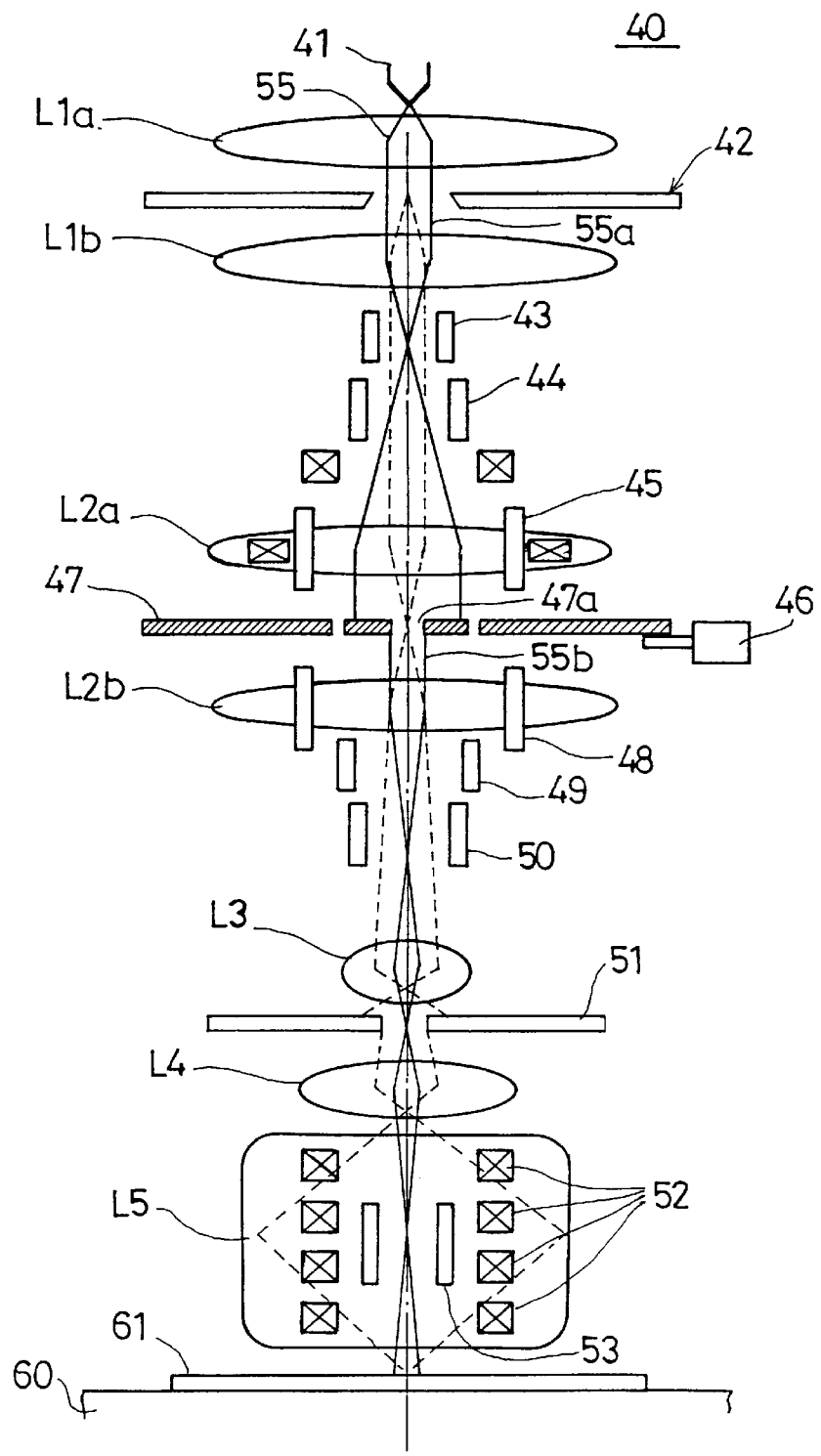
FIG. 3 is a diagram showing a schematic cross-sectional view of a block irradiation type electron beam exposure device according to an embodiment of the present invention.

FIG. 3 is a diagram showing a schematic cross-sectional view of a block irradiation type electron beam exposure device 40 according to an embodiment of the present invention.

As shown in FIG. 3, the block irradiation type electron beam exposure device 40 is comprised of an electron gun 41 as an electron beam source, which is located at a top of a column (not shown), an electromagnetic lens L1$a$, a first slit assembly 42, an electromagnetic lens L1$b$, a slit deflector 43, a first deflector 44, an electromagnetic lens L2$a$, a second deflector 45, a second slit assembly 47 which may be moved by a mask stage 46, an electromagnetic lens L2$b$, a third deflector 48, a blanking 49, a fourth deflector 50, an electromagnetic lens L3 for magnification and rotation, an aperture member 51, an electromagnetic lens L4, an electromagnetic type main deflector 52, an electrostatic sub-deflector 53, and an electromagnetic lens L5 which is located at a bottom of the column (not shown). The numeral 60 indicates a stage on which a wafer 61 is provided.

The electron beam 55 from the electron gun 41 is formed as a parallel electron beam by passing through the electromagnetic lens L1$a$ and its cross-section is formed into a rectangular shape by passing through the first slit assembly 42.

The electron beam 55$a$ having a thus-formed rectangular cross section is properly polarized by passing through the electromagnetic lens L1$b$, the slit deflector 43, the first deflector 44, the electromagnetic lens L2$a$, and the second deflector 44, and reaches an opening 47$a$, which may be selected from among a plurality of openings, formed in the second slit assembly 47. The cross-section of the electron beam 55$a$ may be formed into an arbitrary rectangular shape as it passes through the opening 47$a$.

The electron beam 55$b$ having a thus-formed cross section may be focused on the upper surface of the wafer 61 on the stage 60 after passing through the electromagnetic lens L2$b$, the third deflector 48, the blanking 49, the fourth deflector 50, the electromagnetic lens L3, the aperture member 51, the electromagnetic lens L4 and so on. The electron beam 55$b$ may be polarized by the main deflector 52 and the sub-deflector 53, and used to scan the wafer 61 so that a resist film provided on the surface of the wafer 61 is exposed to the electron beam 55b in accordance with a predetermined circuit pattern previously input to a computer.

Next, the first slit assembly 42 which forms a main portion of the present invention will be explained with reference to FIGS. 4A through 7.

Figure 4A:
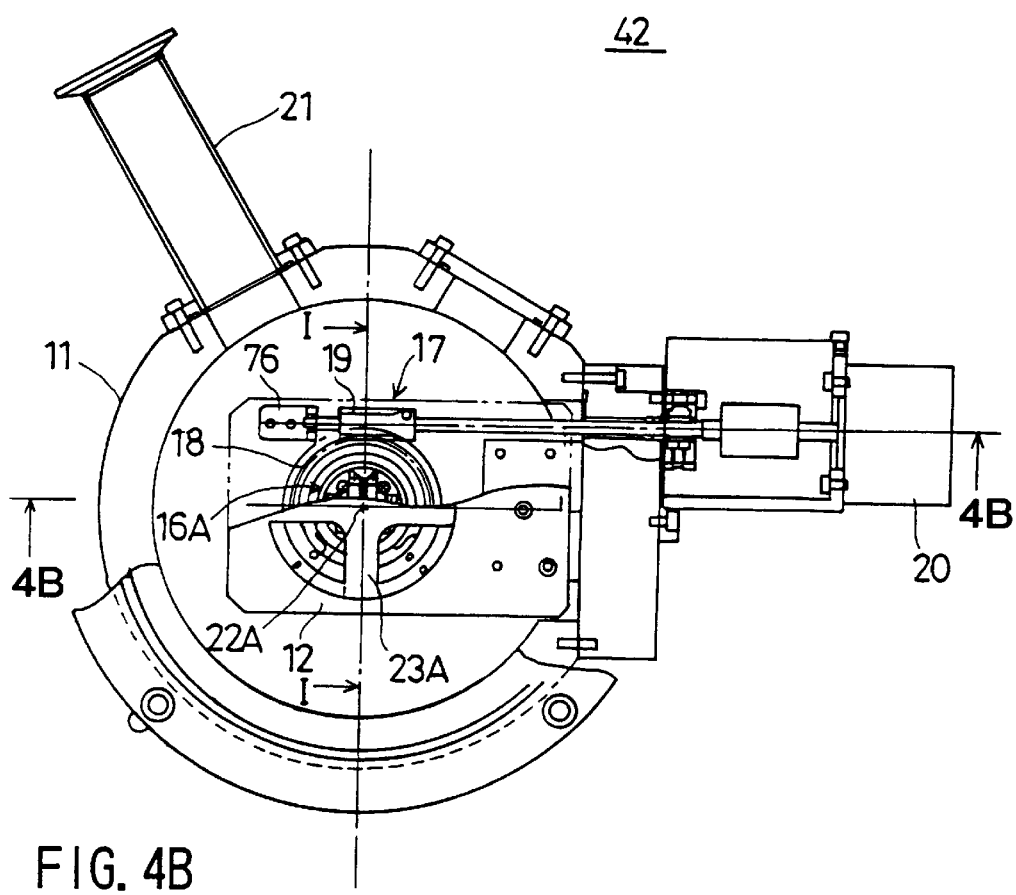
FIG. 4A is a diagram showing a top view of a first slit assembly used in an electron beam exposure device according to an embodiment of the present invention.
Figure 4B:
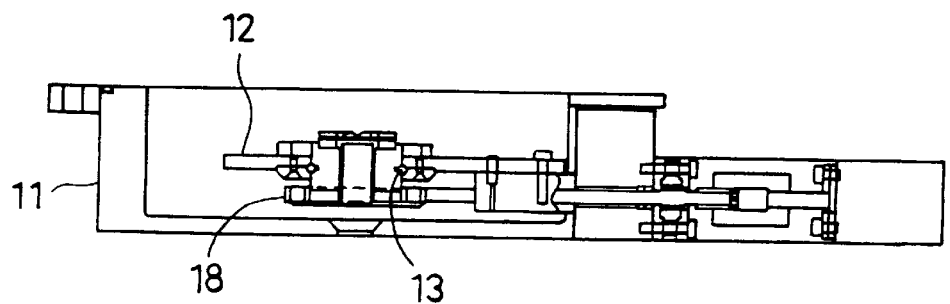
FIG. 4B is a diagram showing a crosssectional view of the slit assembly shown in FIG. 4A.
Figure 5B:
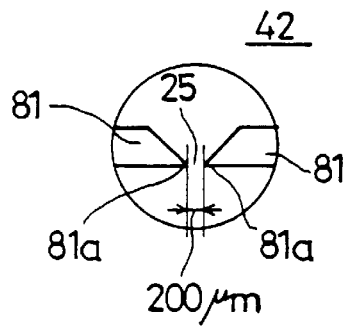
FIG. 5 is a diagram showing a cross-sectional view of a vicinity of a stage of the first slit assembly cut along a line I—I shown in FIG. 4B in a magnified scale.
Figure 5C:
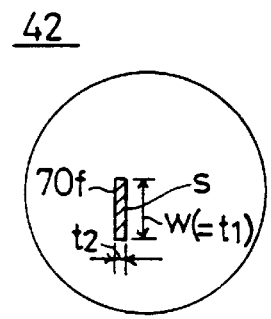
Figure 5A:
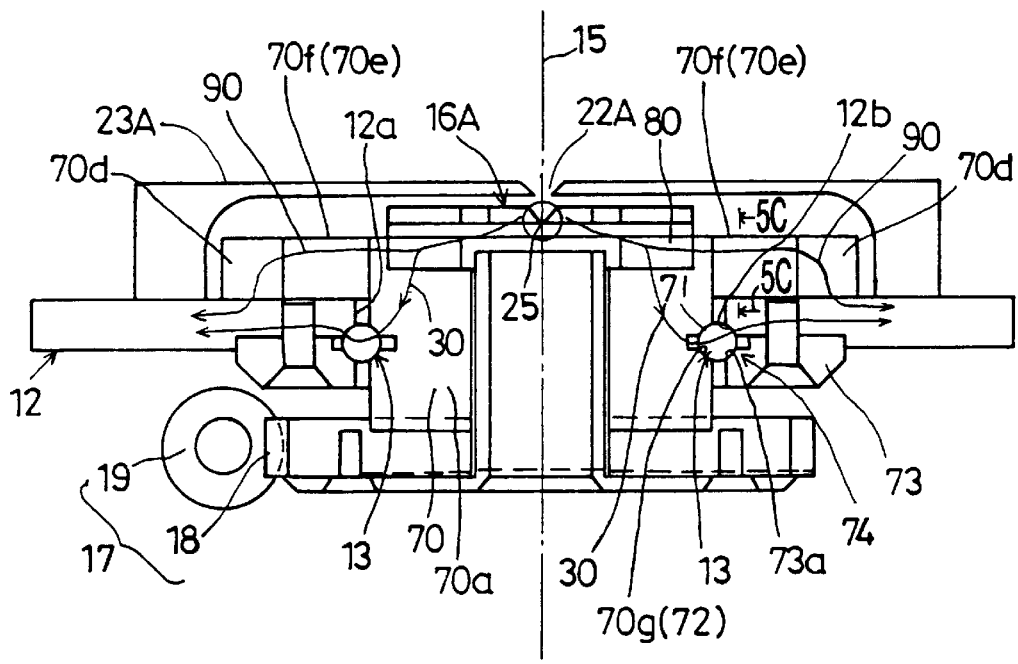
Figure 6:
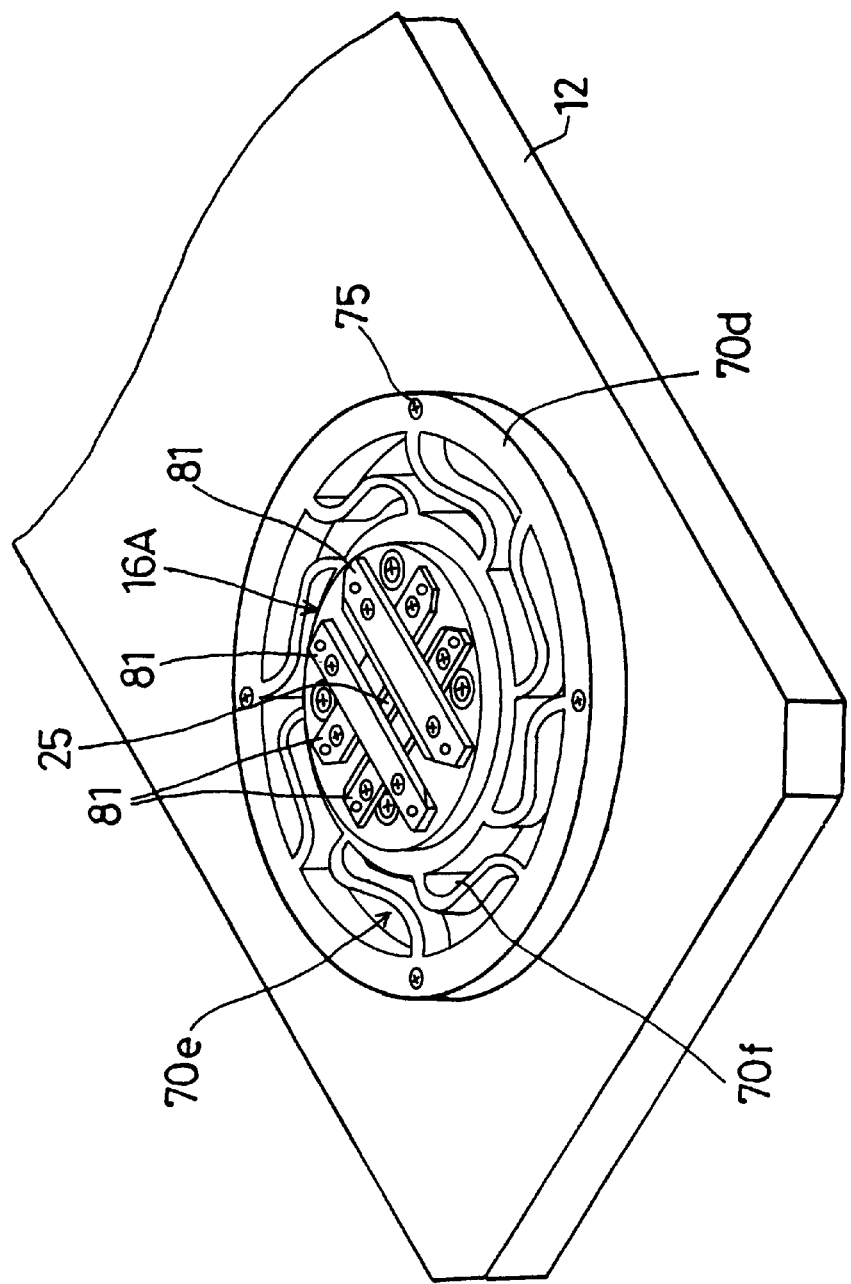
FIG. 6 is a diagram showing a perspective view of a stage may be used in the slit assembly.
Figure 7:
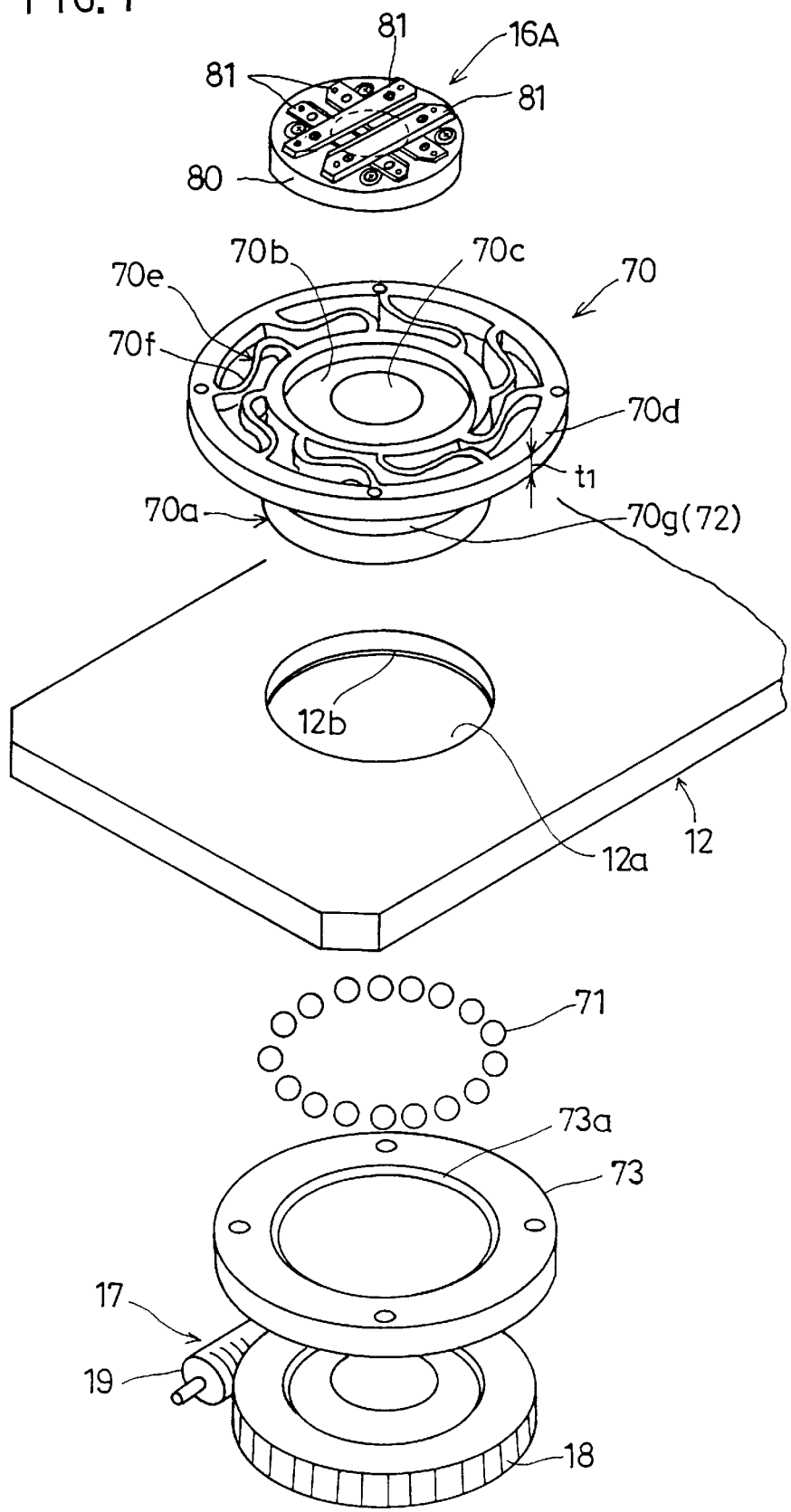
FIG. 7 is a diagram showing an exploded perspective view of the stage shown in FIG. 6.

FIG. 4A is a diagram showing a top view of a first slit assembly 42 used in an electron beam exposure device according to an embodiment of the present invention and FIG. 4B is a diagram showing a cross-sectional view of the slit assembly 42 shown in FIG. 4A. FIG. 5 is a diagram showing a cross-sectional view of a vicinity of a stage of the first slit assembly 42 cut along a line I—I shown in FIG. 4B in a magnified scale. FIG. 6 is a diagram showing a perspective view of a stage that may be used in the slit assembly 42 and FIG. 7 is a diagram showing an exploded perspective view of the stage shown in FIG. 6. In the above figures, elements which are the same as the ones in FIGS. 1A, 1B and 2 are indicated by the same reference numerals.

Figure 1A:
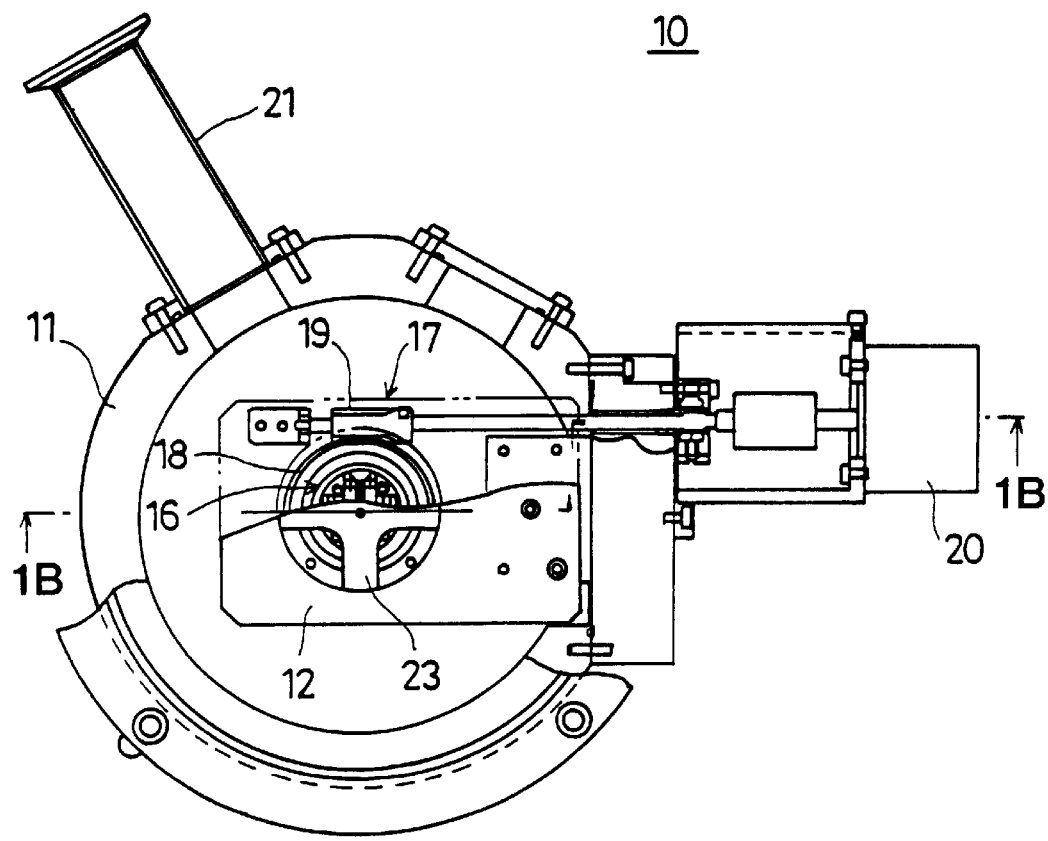
FIG. 1A is a diagram showing a top view of a first slit assembly used in a conventional electron beam exposure device.
Figure 1B:
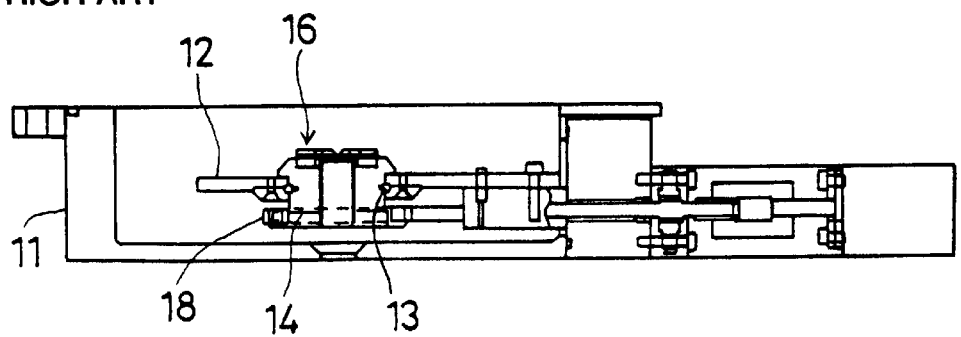
FIG. 1B is a diagram showing a crosssectional view of the slit assembly shown in FIG. 1A.
Figure 2:
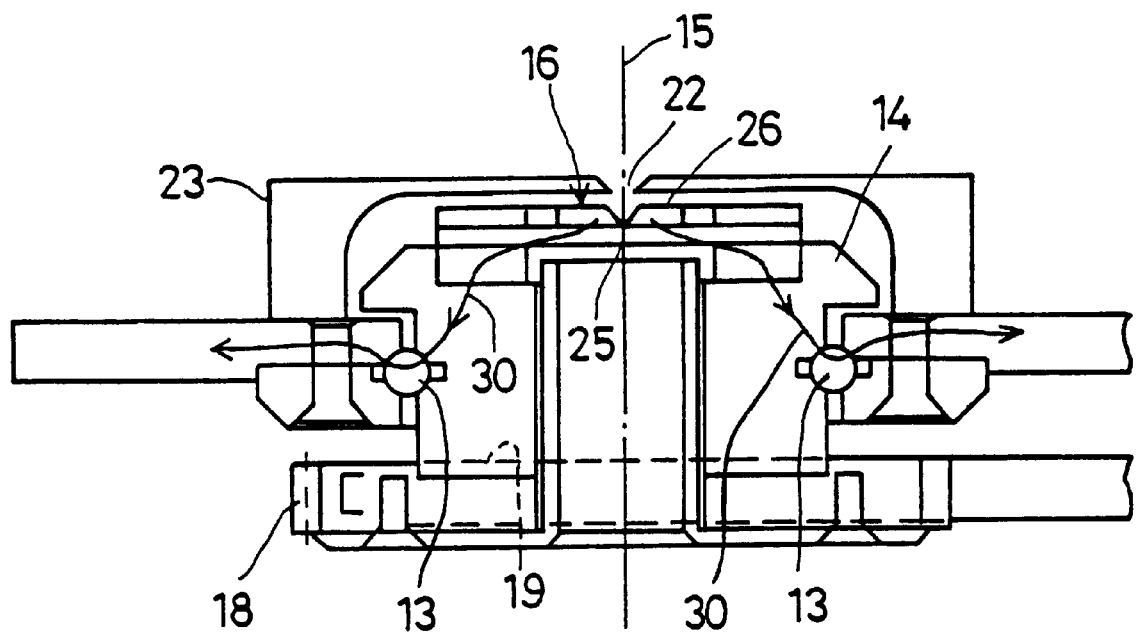
FIG. 2 is a diagram showing a cross-sectional view of a vicinity of a stage of the first slit assembly shown in FIG. 1B in a magnified scale.

The structure of the first slit assembly 42 used in the electron beam exposure device 40 according to an embodiment of the present invention is substantially the same as that of the first slit assembly 10 shown in FIGS. 1A, 1B and 2 except for the structure of a stage 70.

As shown in FIGS. 4A and 4B, the first slit assembly 42 includes a housing 11, in which a base 12 made of a copper material is fixed. The interior of the housing 11 can be maintained at a negative pressure, i.e., a vacuum by exhausting the interior via an exhaust port 21. A motor 20 is provided outside of the housing 11.

The stage 70 is rotatably supported by the base 12 with respect to a vertical axis 15 via a bearing 13. A slit member 16A is fixed on the stage 70 and a worm gear 17 is provided with the stage 70. The worm gear 17 and the motor 20 form a stage rotation adjusting mechanism.

The stage 70 may be made of beryllium copper, and as shown in FIGS. 6 and 7, the stage 70 may be comprised of a main body 70a, a flange portion 70d and a spring portion 70e. The main body 70a includes a concave portion 70b on the upper surface and a hole 70c is formed in the center thereof. The flange portion 70d has a circular shape and is provided at an upper side of the main body 70a. The spring portion 70e is provided between the main body 70a and the flange portion 70d, and may be comprised of eight pieces of a leaf spring member 70f having substantially a "S" shape.

Each of the leaf spring members 70f may be provided in the circumferential direction with an equal spacing therebetween so that one end of the spring is in contact with the main body 70a and the other end is in contact with the inner periphery of the flange portion 70d. The portion of the leaf spring 70f contacting the main body 70a or the flange portion 70d is formed so as not to bend upon application of an external force and is projected in a diametrical direction of the stage 70. The spring portion 70e may be formed by hollowing a part of the flange portion 70d which is extending from the outer surface of the main body 70a using a method such as electrical discharge machining so as to leave portions corresponding to the leaf spring members 70f.

The bearing 13 used in the slit assembly 42 may be comprised of a plurality of balls 71, an inner race 72 and an outer race 74. The inner race 72 is formed by a V-groove 70g provided around the side surface of the main body 70a of the stage 70. The outer race 74 is comprised of a chamfer portion 12b of a hole 12a formed in the base 12 and a chamfer portion 73a of a ring 73 which is fixed to the lower surface of the base 12.

The main body 70a of the stage 70 penetrates or extends into the hole 12a of the base 12 and is rotatably supported by the bearing 13. As shown in FIG. 6, the flange portion 70d of the stage 70 is fixed to the upper surface of the base 12 by screws 75.

Next, a mechanism for the rotation of the main body 70a of the stage 70 will be explained with reference to FIG. 8A through 8C.

Figure 8A:
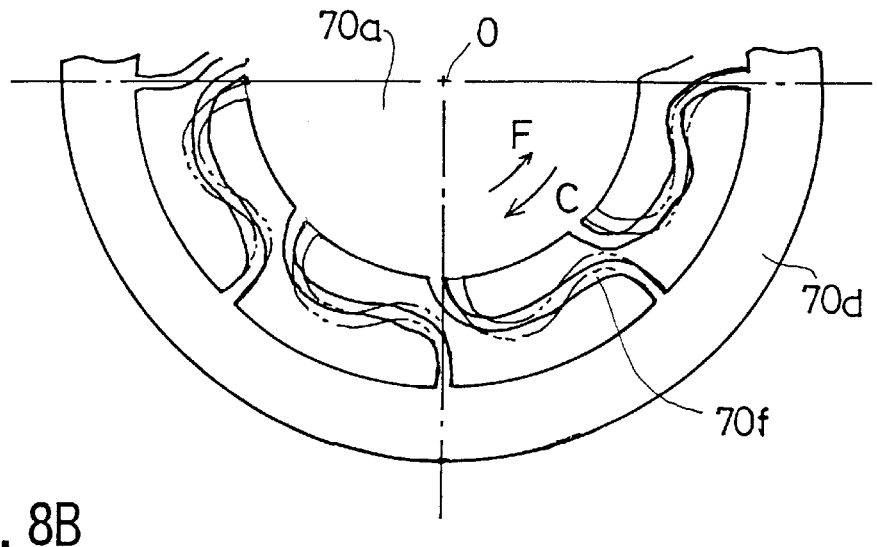
FIG. 8A is a diagram for explaining a rotation mechanism of a main body of a stage used in the first slit assembly according to an embodiment of the present invention.
Figure 8B:
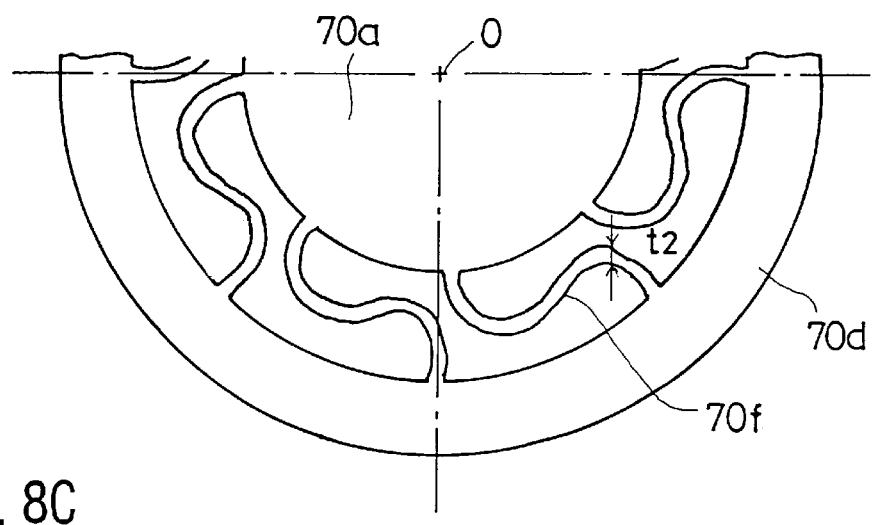
FIG. 8B is a diagram for explaining a rotation mechanism of the main body of the stage used in the first slit assembly according to the embodiment of the present invention.

First, FIG. 8B is a diagram showing an initial state of the leaf spring members 70f. A center of the main body 70a is depicted by 0. Each of the leaf spring members 70f may be deformed so as to be expanded so as to assume a state shown in FIG. 8A. The original position of each of the leaf spring members 70f is denoted by the dotted lines in FIG. 8A. In this manner, the main body 70a of the stage 70 may be rotated a few degrees, with respect to the flange portion 70d, in the clockwise direction (indicated by an arrow C) from the initial position shown in FIG. 8B. At this time, a return force of the leaf spring members 70f for urging a return to the original position is generated and this is depicted by an arrow F in FIG. 8A.

Figure 8C:
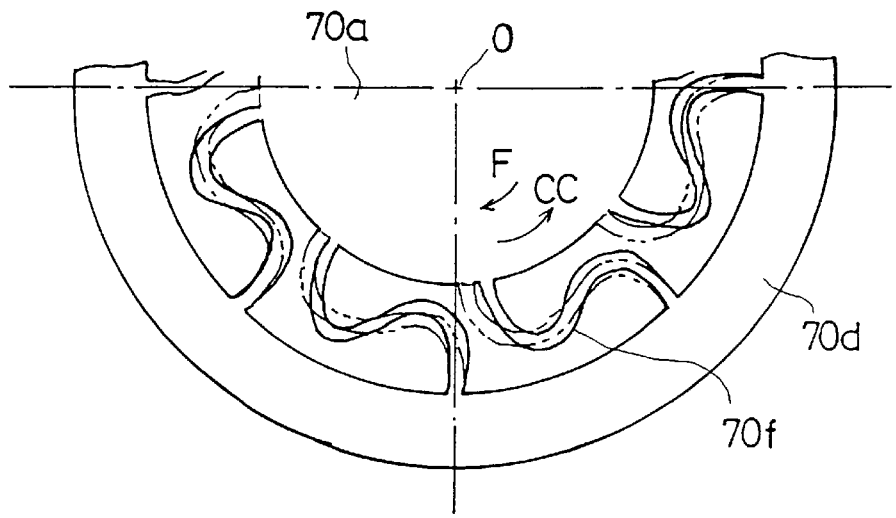
FIG. 8C is a diagram for explaining a rotation mechanism of the main body of the stage used in the first slit assembly according to the embodiment of the present invention.

Also, each of the leaf spring members 70f may be deformed so as to be squeezed or contracted so as to assume a state shown in FIG. 8C. The original position of each of the leaf spring members 70f is denoted by the dotted lines in FIG. 8C. In this manner, the main body 70a of the stage 70 may be rotated a few degrees, with respect to the flange portion 70d, in the counter clockwise direction (indicated by an arrow CC) from the initial position shown in FIG. 8B. At this time, a return force of the leaf spring members 70f for urging a return to the original position is generated and this is depicted by an arrow F in FIG. 8C.

Because each of the leaf spring members 70f is equally expanded or contracted, the position of the center 0 of the main body 70a is not moved when the main body 70a is rotated. Thus, no force in the radial direction acts on the bearing 13 when the main body 70a is rotated, and hence generation of uneven contact of the bearing 13 may be avoided.

Also, the spring portion 70e (i.e., eight pieces of the leaf spring members 70f) functions as a heat transfer path in the first slit assembly 42 and this will be described later.

A worm wheel 18 is fixed to the lower end of the main body 70a. A worm 19 is supported by a supporting member 76 which is fixed to the lower surface of the base 12. The worm 19 is engaged with the worm wheel 18. As mentioned above, the worm 19 is operated by the motor 20 which is provided outside of the housing 11 and a worm gear 17 is formed by the worm 19 and the worm wheel 18.

The slit member 16A is engaged with a concave portion 70b on the upper surface of the main body 70a and fixed to the surface using screws. The slit member 16A may be formed by combining four slit forming members 81 on a disc 80, which is made of either molybdenum or tungsten and has a hole at the center thereof, as shown in FIG. 7 so that a slit 25 of about 200 $\mu$m×200 $\mu$m is formed by a knife edge portion 81a (refer to a small circle shown in FIG. 5) of each of the slit forming members 81. The slit forming members 81 may be made of, for example, tungsten and the reason that tungsten can be used for the slit forming member 81 is because the heat-dissipating ability of the slit member 16A may be improved as described later.

The slit member 16A is covered by a cover 23A, which is fixed to the base 12, having substantially a cross shape. The cover 23A has a hole at the center thereof.

Next, the operation and the characteristics of the first slit assembly 42 having the abovementioned structure will be described.

The electron beam irradiated from the electron gun passes through the hole 22A and reaches the slit 25 where a peripheral portion of the beam is blocked by the slit member 16A (i.e., by the knife edge portion 81a of the slit forming member 81). Thus, the electron beam which is passed through the slit 25 has a cross-section matched with the shape of the slit 25. The electron beam from the first slit assembly 42 is projected onto a wafer so that a LSI pattern is formed precisely.

The main body 70a of the stage 70 (i.e., the slit member 16A) may be rotated a few degrees via the worm gear 17 by properly operating the motor 20 before the irradiation so that a rotation error of an image (an electron beam) from the first slit assembly 42 on the second slit assembly 47 due to a setting accuracy of the electromagnetic lens L1b or a subtle change in the strength of the electromagnetic lens Lb1 is in an allowable range. In other words, the parallelism and the alignment of an image (an electron beam) from the first slit assembly 42 with respect to the sides of the opening (slit) of the second slit assembly are finely adjusted so as to maintain the rotation error associated with the image from the first assembly 42 within a predetermined allowed range. The main body 70a of the stage 70 may be rotated by elastically deforming the spring portion 70e (the eight pieces of the leaf spring members 70f) in the thickness t1 direction (refer to FIG. 7).

The periphery portion of the electron beam from the electron gun irradiates the vicinity of the slit 25 formed by the slit forming members 81, and hence the temperature of the slit forming members 81, especially the knife edge portion 81a of each of the slit forming members 81 is increased. As shown in FIG. 5, the heat generated in the slit forming members 81 is transferred, in that order, to the disc 80, the stage 70, and the base 12 and is dissipated from the base 12.

With regard to the heat transfer path from the stage 70 to the base 12, a new heat transfer path 90 via the leaf spring members 70f and the flange portion 70d is provided according to the present invention in addition to the heat transfer path 30 via the bearing 13.

Thus, according to the present invention, the heat dissipating ability of the first slit assembly 42 may be improved, as compared to a conventional first slit assembly, due to the presence of the two heat transfer paths 30 and 90.

Also, since the heat transfer path 90 is formed by the leaf spring members 70f and the flange portion 70d and each of the leaf spring members 70f is formed into a plate, not a line, each of the leaf spring members 70f has a thickness w corresponding to the thickness t1 of the flange portion 70d and its cross section S is relatively large as shown in a large circle in FIG. 5, the thermal resistance of the heat transfer path 90 is significantly low compared with the heat transfer path 30 which includes small contacting areas between the balls 71 and the inner race 72 and the outer race 74. For this reason, the heat generated in each of the slit forming members 81 of the first slit assembly 42 may also be dissipated more efficiently as compared to a conventional first slit assembly.

Since the heat transfer path 90 is provided with the first slit assembly 42 according to the embodiment of the present invention and the thermal resistance of the heat transfer path 90 is low, the degree of the temperature increase of the slit forming members 81 upon irradiation of the electron beam may be suppressed significantly, and hence it is possible to prevent melting or damaging of, for instance, the knife edge portion 81a of the slit forming member 81. Thus, by using the electron beam irradiating device according to the present invention, a circuit pattern may be formed with high precision.

Also, since the heat dissipating ability of the first slit assembly 42 may be improved, it is possible to increase the strength of the electron beam from the electron gun in order to increase the speed of forming a circuit pattern. Therefore, production of the LSI may be improved according to the present invention.

Moreover, when ozone gas is used to eliminate charge-up (or dust) in the column of the electron beam exposure device 40, the surface of the slit member 16 is not easily oxidized upon contact with the ozone gas since the temperature of the slit forming members 81 is kept low. Since the surface of the slit forming members 81 (the surface of the first slit assembly 42) is not oxidized, the sides of the rectangular cross-section of the electron beam may be kept straight, and hence precision of a circuit pattern formed by the irradiation of the electron beam is not decreased according to the present invention.

Further, the first slit member 42 has a structure in which the spring portion 70e in the initial state shown in FIG. 8B is deformed a little and assumes the state shown in FIG. 8A or 8C when the main body 70a of the stage 70 is adjusted. As mentioned above, a return force, depicted by an arrow F, of the leaf spring members 70f to the original position is generated and this force is applied to the main body 70a in the state shown in FIG. 8A or 8C. According to the present invention, the return force, F, applied to the main body 70a rotates the worm wheel in one direction so as to absorb the backlash of the worm gear 17. Therefore, the effect of the backlash does not result in a shift of a position in the rotation direction of the stage 70. Thus, the image, which is projected on a wafer through the slit, may be stabilized and not shifted in the rotational direction, and hence circuit pattern formation may be carried out accurately.

Next, modified embodiments of the spring portion 70e of the stage 70 according to the present invention will be described with reference to FIGS. 9 through 11.

Figure 9:
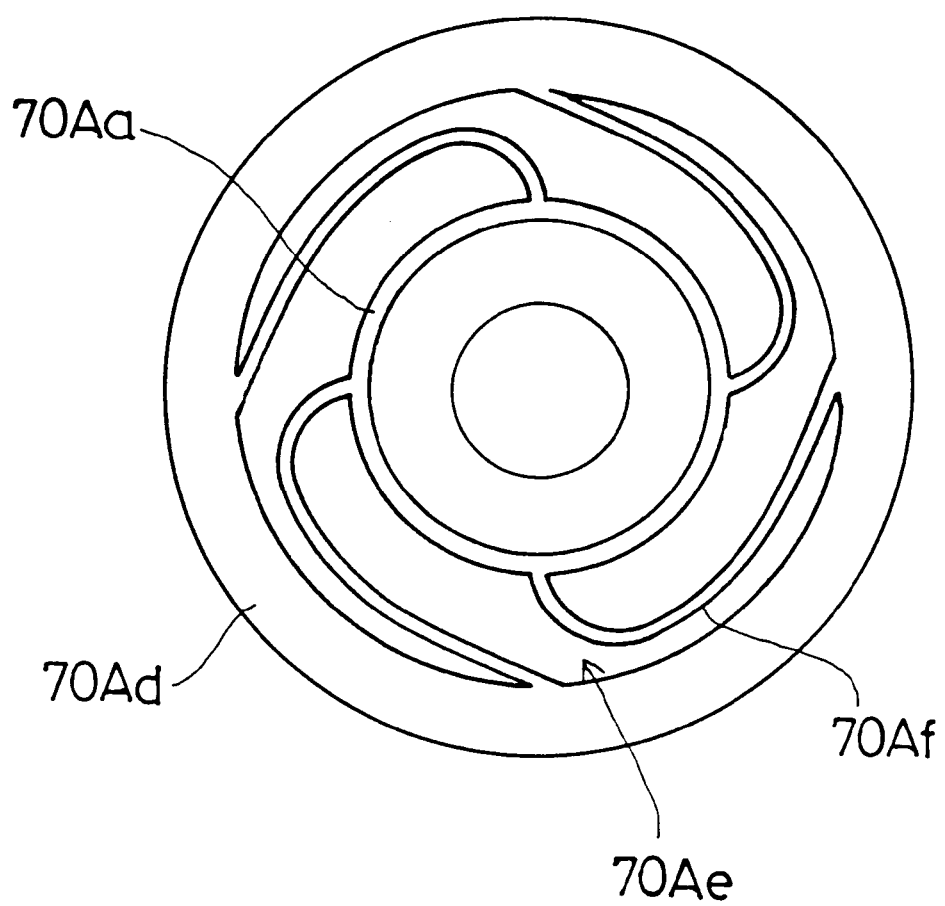
FIG. 9 is a diagram showing a plan view of a first modified embodiment of a stage according to the present invention.

FIG. 9 is a diagram showing a plan view of a first modified embodiment of a stage 70A. As shown in FIG. 9, the stage 70A is comprised of a main body 70Aa, a flange portion 70Ad, a spring portion 70Ae and a plurality (four pieces in this case) of leaf spring members 70Af. The spring portion 70Ae is comprised of the four leaf spring members 70Af having an inverted L shape which is provided in a circumferential direction with equal spacing between each other. The spring portion 70Ae may be formed by hollowing a part of the flange portion 70Ad which extends from the outer surface of the main body 70Aa using a method such as electrical discharge machining so as to leave portions corresponding to the leaf spring members 70Af.

Figure 10:
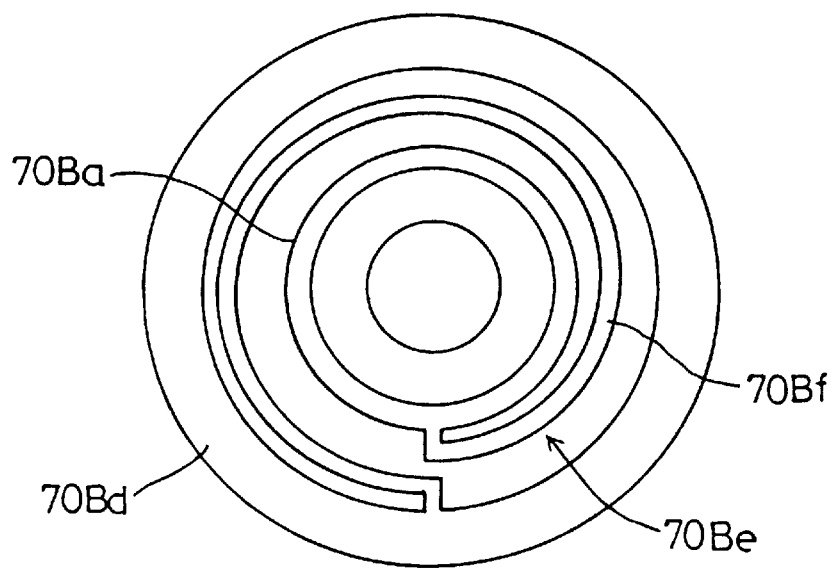
FIG. 10 is a diagram showing a plan view of a second modified embodiment of a stage according to the present invention.

FIG. 10 is a diagram showing a plan view of a second modified embodiment of a stage 70B. As shown in FIG. 10, the stage 70B is comprised of a main body 70Ba, a flange portion 70Bd, a spring portion 70Be and a leaf spring member 70Bf. The spring portion 70Be is comprised of the leaf spring member 70Bf having a helical shape which is provided so as to surround the main body 70Ba. The spring portion 70Be may be formed by hollowing a part of the flange portion 70Bd which extends from the outer surface of the main body 70Ba using a method such as electrical discharge machining so as to leave a portion corresponding to the leaf spring member 70Bf.

Figure 11:
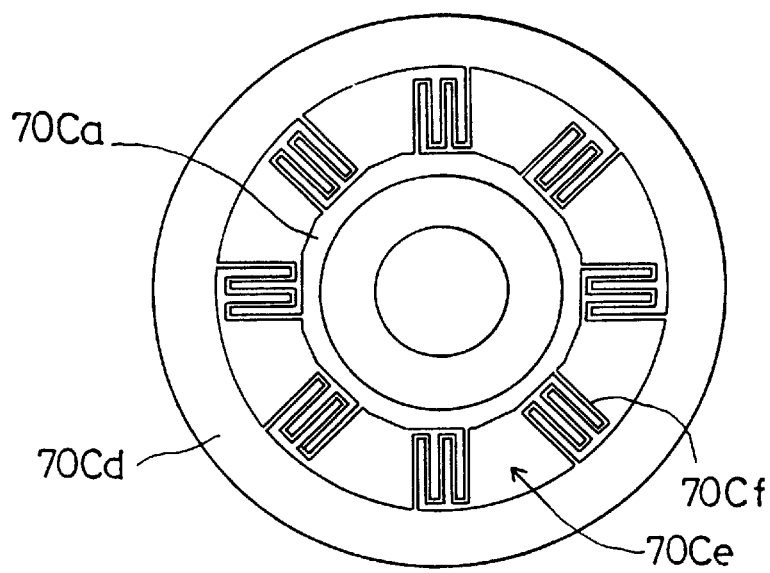
FIG. 11 is a diagram showing a plan view of a third modified embodiment of a stage according to the present invention.

FIG. 11 is a diagram showing a plan view of a third modified embodiment of a stage 70C. As shown in FIG. 11, the stage 70C is comprised of a main body 70Ca, a flange portion 70Cd, a spring portion 70Ce and a plurality (eight pieces in this case) of leaf spring members 70Cf. The spring portion 70Ce is comprised of the four leaf spring members 70Cf having a zigzag shape which is provided in a circumferential direction with equal spacing between each other. The spring portion 70Ce may be formed by hollowing a part of the flange portion 70Cd which extends from the outer surface of the main body 70Ca using a method such as electrical discharge machining so as to leave portions corresponding to the leaf spring members 70Cf.

Each of the above-mentioned spring portion 70Ae, 70Be and 70Ce in the respective stage 70A, 70B and 70C has substantially the same effect as the spring portion 70e in the stage 70.

The present invention is not limited to the above-mentioned embodiments, and variations and modifications may be made without departing from the scope of the present invention.

What is claimed is:

1. An electron beam exposure device in which an electron beam from an electron beam source is passed through at least a slit of a first slit assembly, said first slit assembly comprising:
   a base;
   a bearing assembly;
   a stage having an integral first portion rotatably supported by said base via said bearing assembly to form a first heat transfer path and having an integral second portion non-rotatably supported by said base to form a second heat transfer path;
   a stage rotation adjusting mechanism to adjust rotation of said stage; and
   a slit member supported by said stage to pass the electron beam.

2. The electron beam exposure device as claimed in claim 1, wherein the second heat transfer path is comprised of an elastic portion provided between said stage and said base.

3. The electron beam exposure device as claimed in claim 2, wherein said elastic portion is comprised of a plurality of leaf spring members.

4. The electron beam exposure device as claimed in claim 3, wherein said plurality of leaf spring members are provided in a circumferential direction with equal spacing therebetween.

5. The electron beam exposure device as claimed in claim 4, wherein each of said plurality of leaf spring members has a curved shape.

6. The electron beam exposure device as claimed in claim 4, wherein each of said plurality of leaf spring members has a plate-like shape.

7. The electron beam exposure device as claimed in claim 2, wherein said elastic portion is comprised of a single leaf spring member.

8. The electron beam exposure device as claimed in claim 7, wherein said single leaf spring member has a plate-like shape.

9. The electron beam exposure device as claimed in claim 2, wherein irradiation of said electron beam is performed while said elastic portion is elastically deformed.

10. An electron beam exposure device in which an electron beam from an electron beam source is passed through at least a slit of a first slit assembly, said first slit assembly comprising:
    a base;
    a bearing assembly;
    a stage rotatably supported by said base via said bearing assembly;
    a stage rotation adjusting mechanism; and
    a slit member,
    wherein said stage comprises:
       a main body to which said slit member is fixed,
       a flange portion integral with said main body and fixed to said base, said flange portion being located outside of said main body so as to partially surround said main body, and
       a spring portion, integral with said main body and said flange portion, which transfers heat of said main body to said flange portion and is elastically deformable such that said main body is rotatable with respect to said flange portion.

11. The electron beam exposure device as claimed in claim 10, wherein said spring portion is comprised of a plurality of leaf spring members.

12. The electron beam exposure device as claimed in claim 11, wherein said plurality of leaf spring members are provided in a circumferential direction with equal spacing therebetween.

13. The electron beam exposure device as claimed in claim 12,
    wherein each of said plurality of leaf spring members has a curved shape and a first end is connected to said main body and a second end is connected to said flange portion.

14. The electron beam exposure device as claimed in claim 12, wherein each of said plurality of leaf spring members has a plate-like shape.

15. The electron beam exposure device as claimed in claim 10,
    wherein said spring portion is comprised of a single leaf spring member, provided so as to surround said main body, a first end of said leaf spring member is connected to said main body and a second end is connected to said flange portion.

16. The electron beam exposure device as claimed in claim 15, wherein said single leaf spring member has a plate-like shape.

17. The electron beam exposure device as claimed in claim 10, wherein irradiation of said electron beam is performed while said spring portion is elastically deformed.

18. An electron beam slit assembly, comprising:
    a base to rotatably support a bearing assembly; and
    a stage to support a shaping device for shaping the electron beam, said stage having a body portion rotatably supported by said base via the bearing assembly to form a first heat transfer path, and having an integral flange portion non-rotatably supported by said base and connected to the body portion via a plurality of leaf springs to form a second heat transfer path.

* * * * *

UNITED STATES PATENT AND TRADEMARK OFFICE
CERTIFICATE OF CORRECTION

PATENT NO.: 6,008,495
DATED : December 28, 1999
INVENTOR(S): Hitoshi Tanaka et al.

It is certified that error appears in the above-identified patent and that said Letters Patent is hereby corrected as shown below:

Title Page, [73] Assignee, ADD --Advantest Corporation, Tokyo, Japan--.

Signed and Sealed this

Sixteenth Day of May, 2000

Attest:

Q. TODD DICKINSON

Attesting Officer      *Director of Patents and Trademarks*